United States Patent
Fang (10) Patent No.: US 9,653,385 B1
(45) Date of Patent: May 16, 2017

(54) LEAD FRAME

(71) Applicant: SDI Corporation, Chang Hua (TW)

(72) Inventor: Ya-Cheng Fang, Chang Hua (TW)

(73) Assignee: SDI Corporation, Chang Hua (TW)

(*) Notice: Subject to any disclaimer, the term of this patent is extended or adjusted under 35 U.S.C. 154(b) by 0 days.

(21) Appl. No.: 15/165,054

(22) Filed: May 26, 2016

(51) Int. Cl.
*H01L 23/495* (2006.01)
*H01L 23/31* (2006.01)

(52) U.S. Cl.
CPC .... *H01L 23/49558* (2013.01); *H01L 23/3114* (2013.01); *H01L 23/3142* (2013.01); *H01L 23/4952* (2013.01); *H01L 23/49503* (2013.01); *H01L 23/49582* (2013.01); *H01L 23/49586* (2013.01); *H01L 2224/05139* (2013.01); *H01L 2224/05147* (2013.01); *H01L 2224/05155* (2013.01); *H01L 2224/05582* (2013.01); *H01L 2224/05639* (2013.01); *H01L 2224/29139* (2013.01); *H01L 2224/29583* (2013.01); *H01L 2224/29639* (2013.01); *H01L 2924/0541* (2013.01); *H01L 2924/0665* (2013.01)

(58) Field of Classification Search
CPC .................. H01L 23/49534; H01L 23/49582
See application file for complete search history.

(56) References Cited

U.S. PATENT DOCUMENTS

| | | | |
|---|---|---|---|
| 2010/0195292 A1* | 8/2010 | Ide | H05K 3/32 361/748 |
| 2011/0272184 A1* | 11/2011 | Park | H01L 23/49548 174/255 |
| 2014/0097526 A1* | 4/2014 | Suleiman | H01L 24/33 257/676 |
| 2014/0141550 A1 | 5/2014 | Kuramoto et al. | |
| 2014/0256071 A1 | 9/2014 | Park et al. | |

FOREIGN PATENT DOCUMENTS

| | | | |
|---|---|---|---|
| JP | H05190726 A | * | 7/1993 |
| JP | 2009141274 A | * | 6/2009 |
| TW | 201442302 | | 11/2014 |

* cited by examiner

*Primary Examiner* — Victor A Mandala
*Assistant Examiner* — Regan J Rundio
(74) *Attorney, Agent, or Firm* — Fishman & Associates, LLC (57) ABSTRACT

A lead frame has a metal base, a silver-plated layer, and a silver oxide layer. The silver-plated layer is formed between the metal base and the silver oxide layer. The silver oxide layer has a polar outer surface and a thickness of equal to or more than 1.3 nanometers. The silver oxide layer is beneficial to increase the adhesive strength between the lead frame and the molding compound and avoid delamination of the molding compound from the lead frame, so the lead frame of the present invention can pass a more severe moisture sensitivity level when exposed to the environment.

16 Claims, 9 Drawing Sheets

LEAD FRAME

BACKGROUND OF THE INVENTION

1. Field of the Invention

The present invention relates to a lead frame, more particularly to a lead frame having a silver-plated layer formed on its surface.

2. Description of the Prior Arts

Lead frame is an important component in fabrication processes of semiconductor devices and light-emitting diodes. In addition to the function of supporting the die formed thereon, the lead frame also acts as a circuit board to transmit the inner functions of the electronic components to the outside parts.

Figure 9:
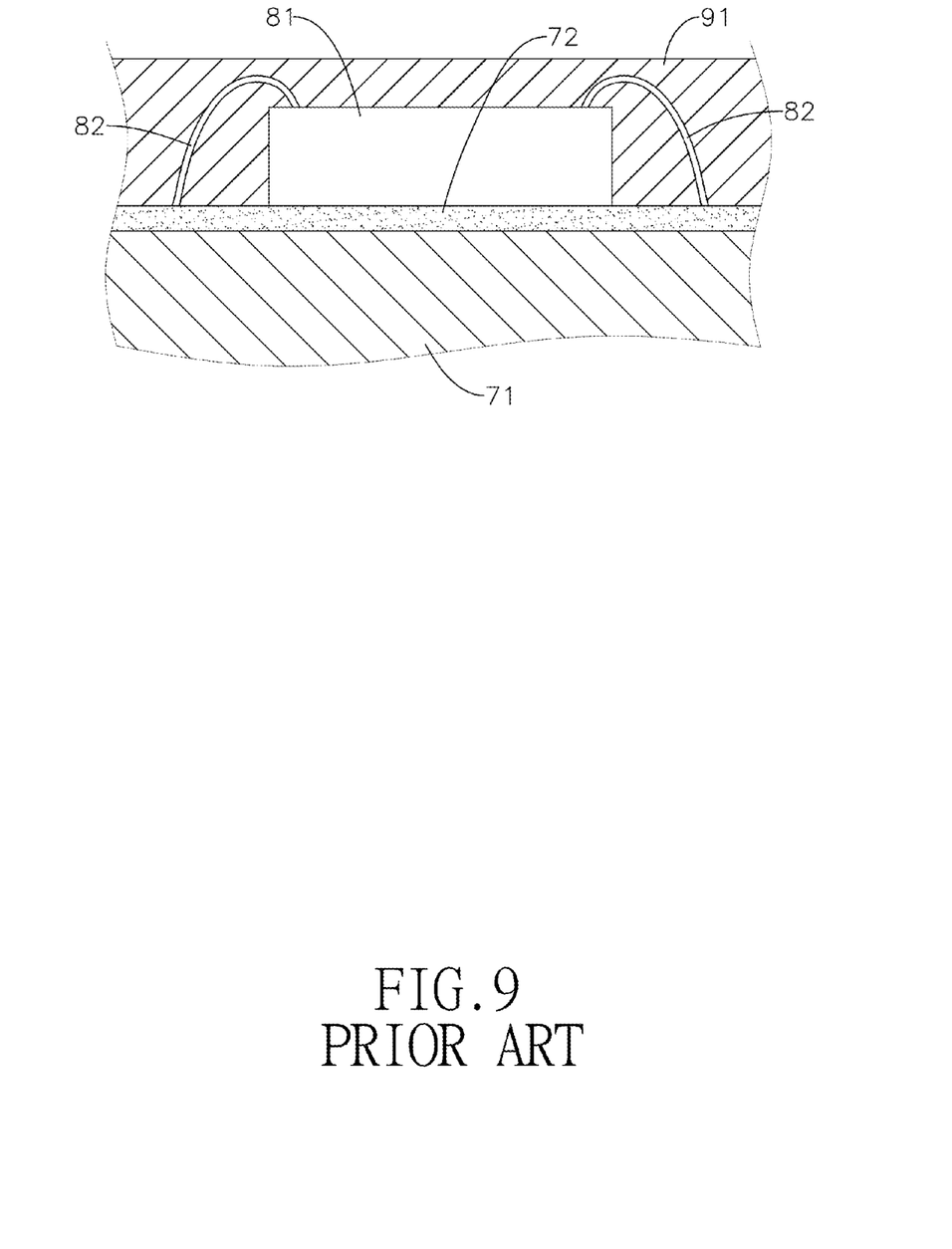
FIG. 9 is a cross-sectional schematic view illustrating that a conventional lead frame is connected with a die by metal wires.

With reference to FIG. 9, a conventional lead frame comprises a metal base 71 and a silver-plated layer 72. In electronic packaging, a die 81 is mounted onto the silver-plated layer 72 of the lead frame and electrically connected with the silver-plated layer 72 by multiple bonding wires 82, so as to transmit electronic signals. In the final stage of fabrication, a molding compound 91 is employed to encapsulate the lead frame, the die 81, and the bonding wires 82 to protect them from physical or chemical damages, thereby achieving the packaging and protection of the integrated circuit.

As silver has super conductivity, the silver-plated layer 72 is formed on the metal base 71 for increasing the signal transmission rate. However, the adhesive strength between the silver-plated layer 72 and the molding compound 91 is insufficient. Thus, the molding compound 91 is apt to delaminate from the lead frame after moisture absorption occurs.

To pass a more severe moisture sensitivity level, a metal surface treatment provided in the prior art is utilized. The metal base of the lead frame is surface-roughened by etching, and a silver-plated layer deposited on the roughened metal base is surface-roughened accordingly. As a result, the roughness treatment can increase the contact area of the roughened silver-plated layer with the molding compound and improve the adhesive strength between the lead frame and the molding compound.

Although the metal surface treatment can try to avoid the occurrence of delamination of the molding compound from the lead frame, the roughened surfaces reduce the bonding forces of wires welded onto the roughened metal base or the roughened silver-plated layer, such that the wire disconnection and the open circuit failure between the die and external circuit likely happen to the conventional lead frame due to the insufficient wire bonding force.

To overcome the shortcomings, the present invention provides a lead frame to mitigate or obviate the aforementioned problems.

SUMMARY OF THE INVENTION

In view of the drawbacks in the prior art, the objective of the present invention is to modify the layered structure of the lead frame, so as to improve the adhesive strength between the lead frame and the molding compound on the premise of maintaining the bonding force between the lead frame and the bonding wires.

To achieve the foresaid objective, the present invention provides a lead frame. The lead frame comprises a metal base, a silver-plated layer disposed on the metal base, and a silver oxide layer disposed on the silver-plated layer. That is, the silver-plated layer is disposed between the metal base and the silver oxide layer. Besides, the silver oxide layer is polar at its outer surface and has a thickness equal to or more than 1.3 nanometers.

With such a polar silver oxide layer having a suitable thickness, the lead frame in accordance with the present invention not only maintains the bonding force with the bonding wires, but also improves the adhesive strength to the molding compound, i.e., polymer such as epoxy resin. Thus, the possibility of delamination between the lead frame and the molding compound after moisture absorption is reduced. In addition, the environmental conditions programmed for the packaging process of the lead frame are favorable to remove water molecules physically adsorbed on the surface of the lead frame, rendering the package product an improved adhesive strength between the lead frame and the molding compound and avoiding the moisture entering the package product. Accordingly, the lead frame with such an arrangement is capable of passing a more severe moisture sensitivity level when exposed to the environment.

Other objectives, advantages and novel features of the invention will become more apparent from the following detailed description when taken in conjunction with the accompanying drawings.

DETAILED DESCRIPTION OF THE PREFERRED EMBODIMENTS

Figure 1:
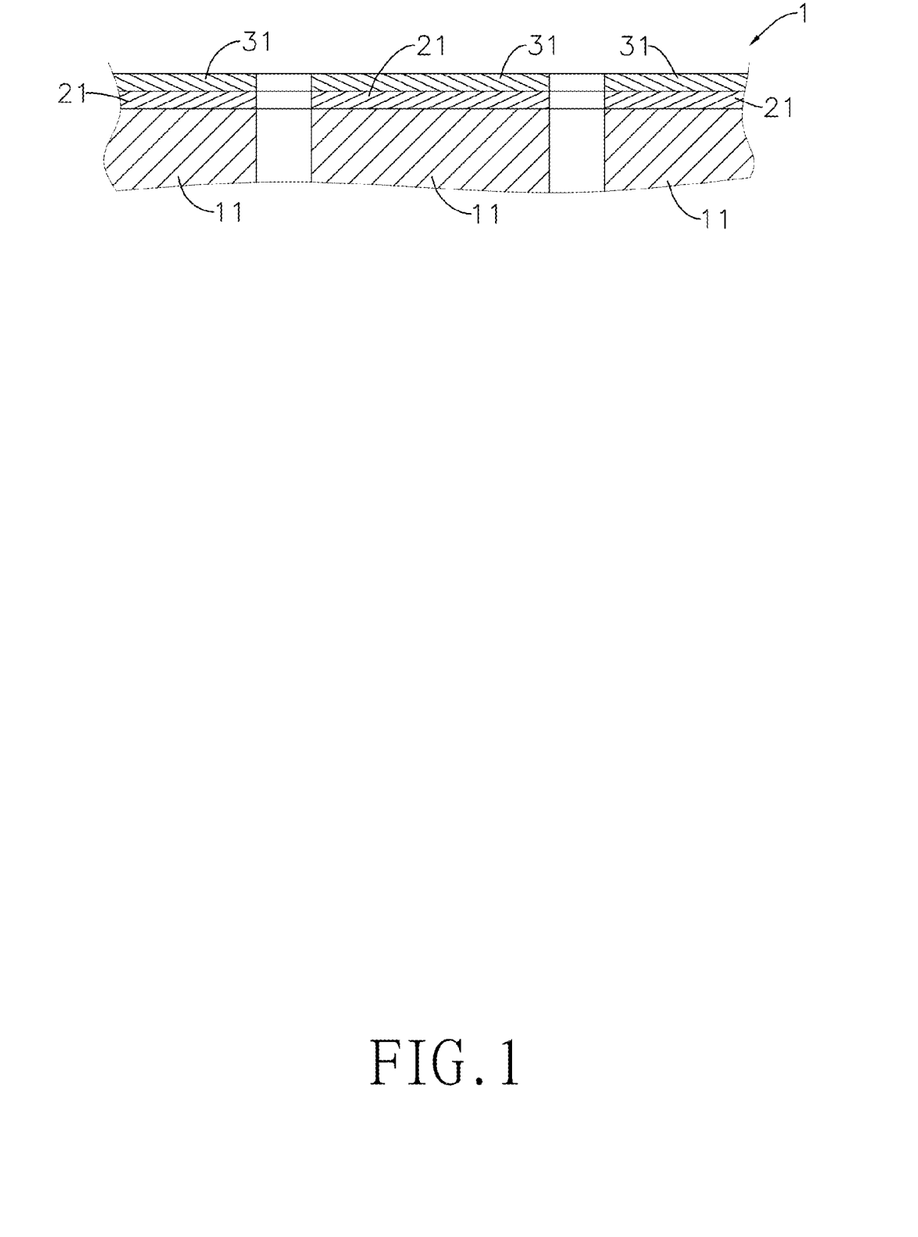
FIG. 1 is a cross sectional schematic view of a lead frame in accordance with the present invention.
Figure 2:
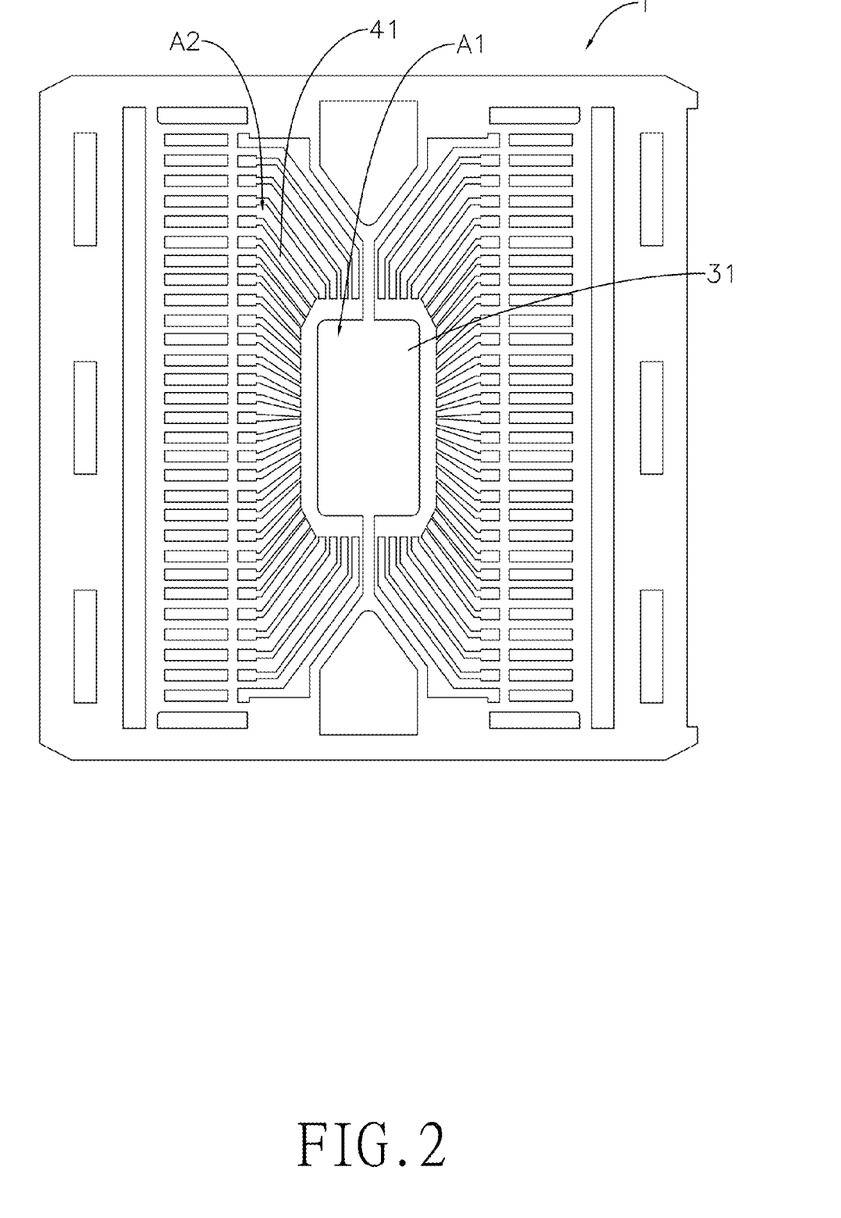
FIG. 2 is a top schematic view of the lead frame in accordance with the present invention.

With reference to FIGS. 1 and 2, the lead frame 1 of the present invention comprises a metal base 11, a silver-plated layer 21, and a silver oxide layer 31. The silver-plated layer 21 is disposed on the metal base 11, and the silver oxide layer 31 is disposed on the silver-plated layer 21. In the lead frame 1 of the present invention, the outer surface of the silver oxide layer 31 is polar. A thickness of the silver oxide layer 31 may be equal to or more than 1.3 nanometers and equal to or less than 2.5 nanometers, and a thickness of the silver-plated layer 21 may be equal to or more than 100 nanometers and equal to or less than 3.5 micrometers. When a reflecting property is demanded, the thickness of the silver oxide layer 31 is set to be equal to or less than 2.5 nanometers for preventing the crystal particles from becoming larger due to the excess of the silver oxide layer 31 in thickness and amount. Thus, the present invention can maintain the reflectivity of the lead frame 1 and improve the adhesive strength between the lead frame and the molding compound, so as to be applicable for the field of light-emitting diodes.

In the lead frame 1 of the present invention, the composition of the silver oxide layer 31 is represented by $Ag_xO_y$. More specifically, the composition of the silver oxide layer 31 may include silver atom bonded with an oxygen atom or multiple oxygen atoms. The composition of the silver oxide layer 31 includes silver(II) oxide, i.e., AgO, silver(I) oxide, i.e., $Ag_2O$ or their combination.

In the lead frame 1 of the present invention, the thickness of the silver oxide layer 31 is preferably equal to or more than 1.8 nanometers and equal to or less than 2.5 nanometers, and the thickness of the metal base 11 is preferably equal to or more than 80 micrometers. More preferably, the thickness of the silver oxide layer 31 is equal to or more than 2 nanometers and equal to or less than 2.5 nanometers. It should be understood that the upper limit of the thickness of the metal base 11 is not particularly limited. One person skilled in the art can modify its thickness depending on the cost or different demands.

Figure 3:
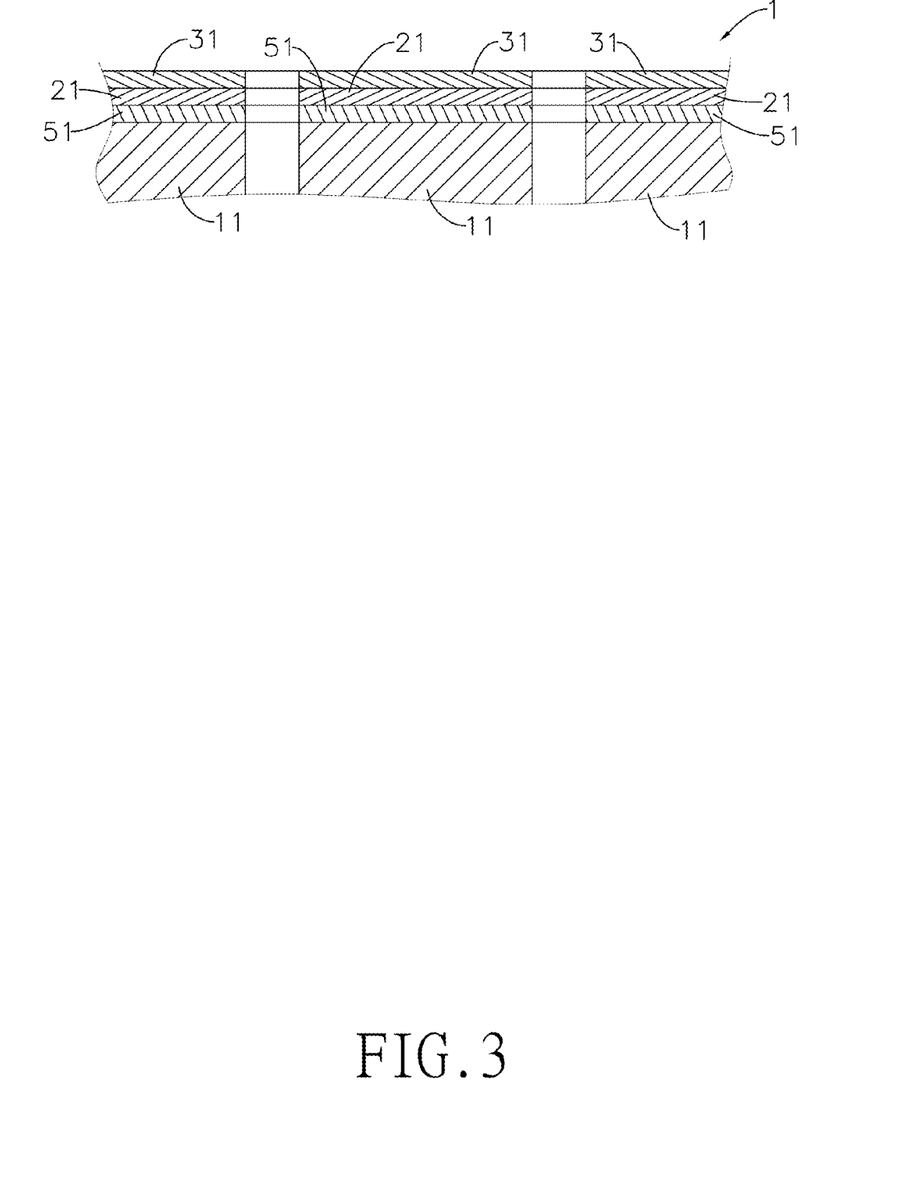
FIG. 3 is a cross sectional schematic view of another lead frame in accordance with the present invention.

With reference to FIG. 3, in one embodiment of the present invention, the lead frame 1 has a roughened layer 51 between the metal base 11 and the silver-plated layer 21, and the silver-plated layer 21 is formed between the roughened layer 51 and the silver oxide layer 31. Said roughened layer 51 may be, but is not limited to, a copper-plated layer or a nickel-plated layer.

To improve the adhesive strength between the lead frame 1 and the molding compound, in the preparation of the lead frame 1 of the present invention, a metal base 11 whose surface is formed with a silver-plated layer 21 is used as the cathode, an insoluble electrode is used as the anode, and an alkaline solution is used as the electrolyte solution. Direct current is supplied to perform an electrochemical reaction, thereby forming a silver oxide layer 31 on the surface of the silver-plated layer 21. In one embodiment of the present invention, the insoluble electrode may be a platinum-plated titanium electrode or an iridium-plated titanium electrode.

In another embodiment of the present invention, an anti epoxy bleed out layer is disposed on an outer surface of the silver oxide layer 31. The anti epoxy bleed out layer is formed by curing an anti epoxy bleed out agent on the silver oxide layer 31. The applicable examples of the anti epoxy bleed out agent of the present invention may be, but are not limited to, commercially available T13 purchased from Atotech, commercially available BA-9 purchased from Nippon Mining & Metals Co. Ltd., or a fluorine-containing organic compound, i.e., Bestguard No. 4 purchased from Chemitech Company.

In the lead frame 1 of the present invention, the silver oxide layer 31 has a surface oxygen content of 20% to 70% and a surface energy of 55 mN/m to 80 mN/m. When the surface energy of the silver oxide layer in the lead frame is less than 55 mN/m, the polarity of the surface of the silver oxide layer is lower and fails to improve the adhesive strength between the lead frame and the molding compound. Accordingly, such a lead frame cannot be effectively applicable in high-end products such as automotive electronic components. On the other hand, when the surface energy of the silver oxide layer in the lead frame is over 80 mN/m, the crystal particles of the silver oxide layer become larger, leading to increase the surface irregularity of the silver oxide layer, and even reduce the wire bonding force and die shear force and deteriorate the reliability of electronic products.

Hereinafter, one skilled in the arts can easily realize the advantages and effects of the present invention from the following examples. It should be understood that the descriptions proposed herein are just preferable examples only for the purpose of illustrations, not intended to limit the scope of the invention. Various modifications and variations could be made in order to practice or apply the present invention without departing from the spirit and scope of the invention.

Example 1

The lead frame 1 of the instant example was prepared as follows.

First, a 19 millimeters×19 millimeters×0.254 millimeters metal base 11 made of copper alloy, C194, was provided.

After removal of the oil of the metal base 11 with an alkaline degreaser, the degreased metal base 11 used as a cathode and a silver plate used as an anode were immersed in an electrolyte of potassium dicyanoargentate and supplied with 2 $A/m^2$ of direct current to form a silver-plated layer 21 on the surface of the metal base 11. A silver-plated carrier was thus obtained.

Then the silver-plated carrier was immersed in an alkaline solution at 45° C. The silver-plated carrier used as a cathode and a platinum-plated titanium electrode used as an anode were supplied with 12 $A/m^2$ of direct current for 45 seconds, so as to form a silver oxide layer 31 on the surface of the silver-plated layer 21 of the silver-plated carrier. Accordingly, a lead frame 1 having a silver oxide layer 31 with suitable polarity was prepared.

With reference to FIGS. 1 and 2, the lead frame 1 prepared by the foresaid method comprises a metal base 11, a silver-plated layer 21, and a silver oxide layer 31. The silver-plated layer 21 is formed on the metal base 11, the silver oxide layer 31 is formed on the silver-plated layer 21; that is, the silver-plated layer 21 is formed between the metal base 11 and the silver oxide layer 31. With the oxygen atom bonding contained in the silver oxide layer 31, the silver oxide layer 31 has a greater polarity at its outer surface. As measured by a thickness analyzer, the silver-plated layer 21 of the lead frame 1 has a thickness of 2 micrometers.

Example 2

In addition to the lead frame of Example 1, a second embodiment of the lead frame was provided. The lead frame of Example 2 was mainly prepared by the method for the lead frame of Example 1. The difference between the Examples 1 and 2 was that the thickness of silver-plated layer formed on the metal base was different by controlling different time durations of supplying direct current.

With reference to FIGS. 1 and 2, the lead frame 1 of Example 2 also comprises a metal base 11, a silver-plated layer 21 formed on the metal base 11, and a silver oxide layer 31 formed on the silver-plated layer 21. The silver-plated layer 21 is formed between the metal base 11 and the silver oxide layer 31. The silver oxide layer 31 is polar at its outer surface because of the oxygen atom bonding in the silver oxide layer 31. As measured by a thickness analyzer, the silver-plated layer 21 of the lead frame 1 of Example 2 has a thickness of 2.5 micrometers.

Comparative Example 1

To prepare the lead frame of Comparative Example 1, a same metal base used in Example 1 was also provided and cleaned with an alkaline degreaser to remove the oil formed thereon. Then the degreased metal base used as a cathode and a silver plate used as an anode were immersed in an electrolyte of potassium dicyanoargentate and supplied with 2 $A/m^2$ of direct current to form a silver-plated layer on the surface of the metal base. A lead frame of Comparative Example 1, which was identical to the silver-plated carrier as prepared in Example 1, was thus prepared.

By the foresaid preparation, the lead frame prepared by Comparative Example 1 only comprises a metal base and a silver-plated layer. As measured by the thickness analyzer, the silver-plated layer of the lead frame of Comparative Example 1 has a thickness about 2 micrometers.

Comparative Example 2

The lead frame of Comparative Example 2 was mainly prepared by the method for the lead frame of Example 1. The difference between Example 1 and Comparative Example 2 was that the silver-plated carrier of Comparative Example 2 was continuously supplied with 12 $A/m^2$ of direct current for 600 seconds, so as to form a silver oxide layer on the surface of the silver-plated layer. Finally, a lead frame of Comparative Example 2 was prepared.

Comparative Example 3

The lead frame of Comparative Example 3 was mainly prepared by the method for the lead frame of Comparative Example 1. That is, the lead frame of Comparative Example 3 also only comprises a metal base and a silver-plated layer. The difference between the Comparative Examples 1 and 3 was that the silver-plated layer of the lead frame of Comparative Example 3 has a thickness about 2.5 micrometers as measured by thickness analyzer.

Test Example 1: Thickness and Surface Oxygen Content of Silver Oxide Layer

To determine whether a silver oxide layer is formed in the lead frame and identify its feature, the lead frames of Example 1 and Comparative Examples 1 and 2 were detected by electron spectroscopy for chemical analysis, ESCA. The depth profile of silver element (3d) and oxygen element (1s) of each lead frame was obtained to identify the thickness and the surface oxygen content of the silver oxide layer. Experimental results were shown in FIGS. 4 to 6.

Figure 4:
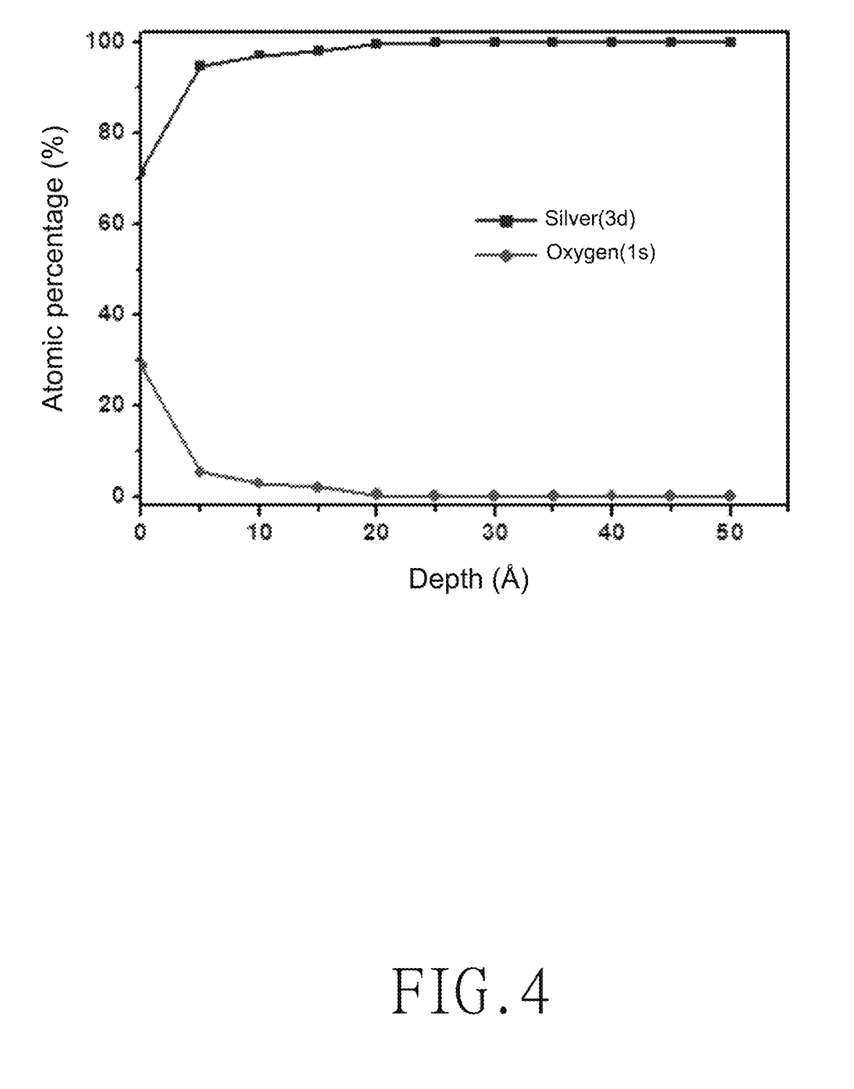
FIG. 4 shows the depth profile of silver (3d) and oxygen (1s) of a lead frame of Example 1.

With reference to FIG. 4, the surface oxygen content of the lead frame of Example 1 was 30% and the depth of oxygen element was about 2 nanometers. It indicated that the thickness of the silver oxide layer in the lead frame of Example 1 was 2 nanometers. Besides, the thickness of the silver oxide layer of the lead frame of Example 2 was about 2 nanometers as detected by ESCA.

Figure 5:
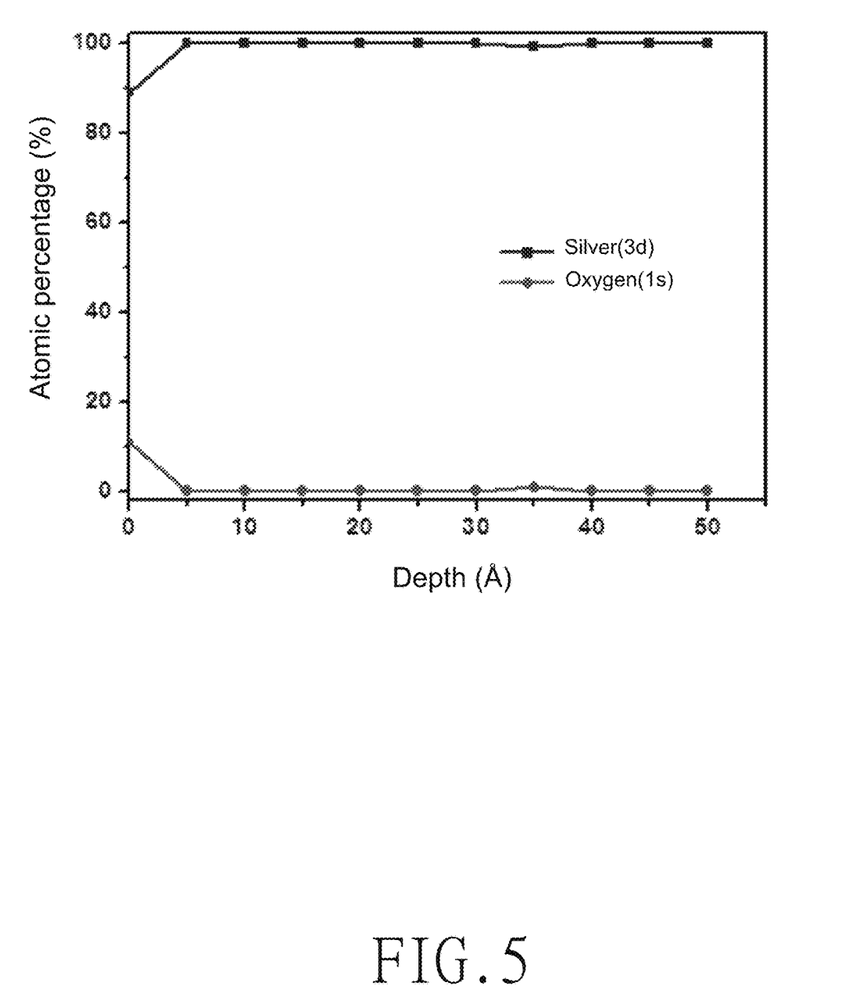
FIG. 5 shows the depth profile of silver (3d) and oxygen (1s) of a lead frame of Comparative Example 1.
Figure 6:
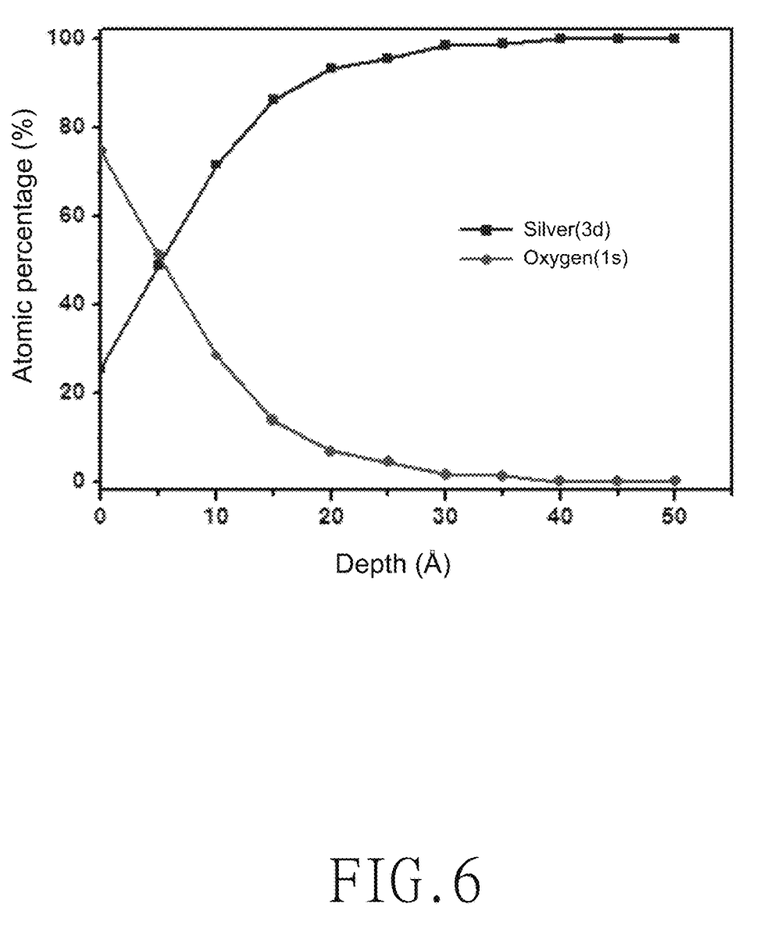
FIG. 6 shows the depth profile of silver (3d) and oxygen (1s) of a lead frame of Comparative Example 2.

However, with reference to FIG. 5, the surface oxygen content of the lead frame of Comparative Example 1 was only 10% and the depth of oxygen element was about 0.5 nanometers. With reference to FIG. 6, the surface oxygen content of the lead frame of Comparative Example 2 was about 75% and the depth of oxygen element was about 4 nanometers.

Further, cyclic voltammetry measurements were performed by using Ag/AgCl reference electrode and scanning within a potential range of 0.25 V to 0.6 V to obtain the redox potentials of the lead frames of Example 1 and Comparative Example 1. Results of redox potentials were shown in FIG. 7.

Figure 7:
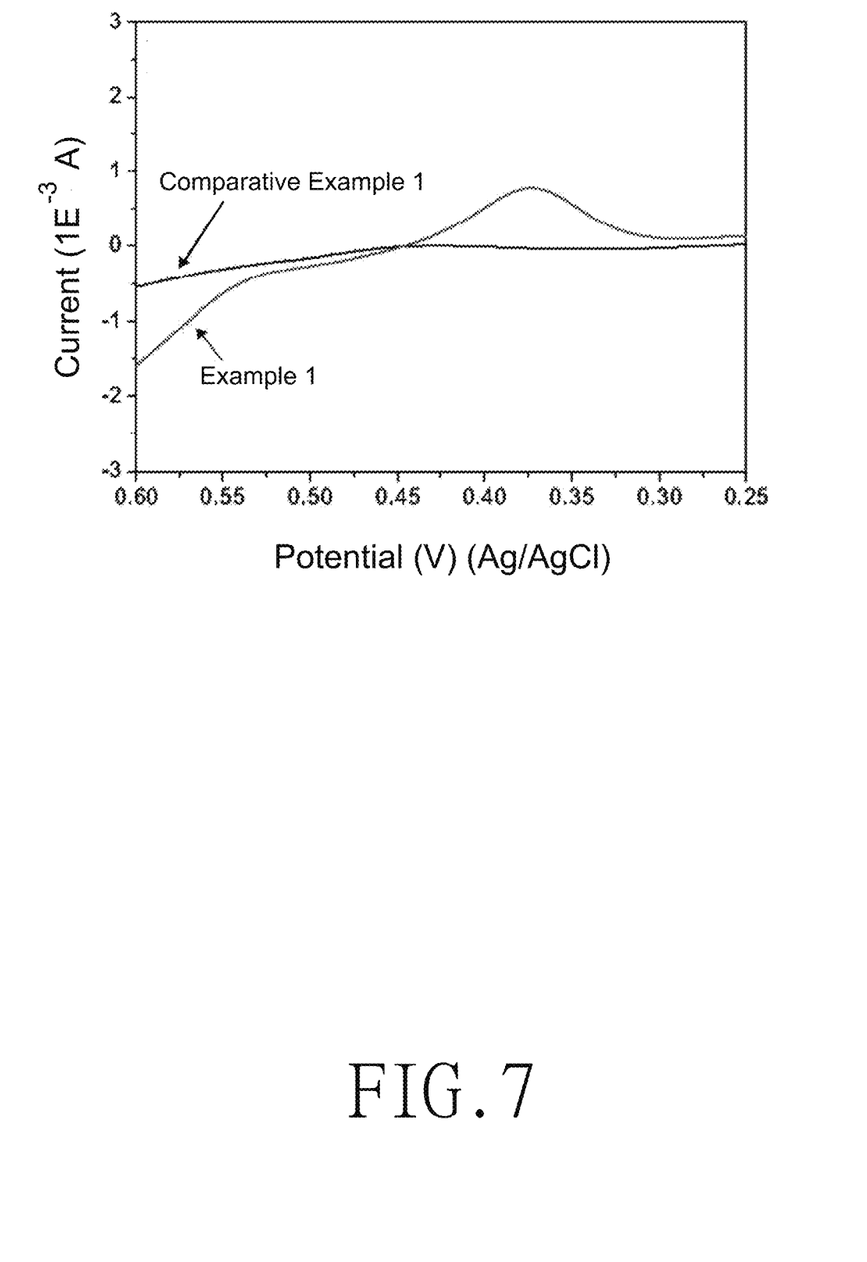
FIG. 7 shows current-voltage curves of the lead frames with regard to Example 1 and Comparative Example 1.

With reference to FIGS. 4 and 7, a peak was observed in the current-voltage curve of the lead frame of Example 1, indicating that the lead frame of Example 1 was truly oxidized at its surface and formed with a silver oxide layer having a suitable thickness. In contrast, no significant peak could be observed from the current-voltage curve for the lead frame of Comparative Example 1 in FIG. 7. The results in FIGS. 5 and 7 indicated that no exact oxidation happened without supplying the direct current to the silver-plated carrier, and thus there was no exact silver oxide layer in the lead frame of Comparative Example 1.

From the comparison results of Example 1 and Comparative Examples 1 and 2, supplying a direct current to the metal base formed with the silver-plated layer ensures that a silver oxide layer is formed in the lead frame. Further, by controlling the time durations of the direct current supplied to the silver-plated carrier, the thickness of silver oxide layer and the surface oxygen content in the lead frame can be effectively set within 1.3 nanometers to 2.5 nanometers and within 20% to 70% respectively, thereby ensuring the applicability of the lead frame.

Test Example 2: Surface Energy

The surface energy of the lead frame prepared by Example 1 and Comparative Example 1 was calculated by Owen-Wendt-Rabel-Kaelble's method. According to the experimental results, the surface energy of the lead frame of Example 1 was 73.32 mN/m, but the surface energy of the lead frame of Comparative Example 1 was only 47.51 mN/m.

The surface energy of the lead frame of Example 1 higher than that of Comparative Example 1 demonstrates again that a silver oxide layer is certainly formed on the surface of the lead frame of Example 1, and the silver oxide layer renders the lead frame of Example 1 a larger polarity at its outer surface.

Test Example 3: Bonding Force Between the Lead Frame and the Gold Wire

In the instant test example, the same gold wires having a wire diameter of 1.2 mil were respectively welded onto the lead frames of Example 1 and Comparative Example 1 to perform a wire pull test according to MIL-STD-883, United States Military Standard-883.

The experimental results showed that the bonding force between the lead frame of Example 1 and the gold wire was 5.05 N, and the bonding force between the lead frame of Comparative Example 1 and the gold wire was 4.29 N.

As the results indicated, instead of reducing the bonding force between the lead frame and the gold wire, forming a silver oxide layer on the silver-plated layer of the lead frame does improve the bonding force between the lead frame and the gold wire. Thus, the possibilities of wire disconnection and open circuit failure are effectively reduced by adopting the lead frame of the present invention.

Test Example 4: Adhesive Strength Between Lead Frame and Molding Compound

The adhesive strength between the lead frame and the molding compound was measured according to the shear method of SEMI-G69-0996, Semiconductor Standard G69-0996. The epoxy molding compound, EK5600GHR purchased from Eternal Materials Co., Ltd., was glued to the lead frames of Example 1 and Comparative Example 1, and then cured at 175° C. for 6 hours to measure the adhesive strength between the lead frame and the molding compound.

As the results indicated, the adhesive strength between the lead frame of Example 1 and the molding compound was 1.326 N; however, for the lead frame of Comparative Example 1, the adhesive strength between the lead frame and the molding compound was only 0.779 N.

From the comparison of the experimental results of Example 1 and Comparative Example 1, the silver oxide layer having a suitable thickness does improve the adhesive strength between the lead frame of Example 1 and the molding compound, allowing the lead frame of the present invention to pass a more severe moisture sensitivity level when exposed to the environment.

Test Example 5: Moisture Sensitivity Level Testing

In the instant test example, the lead frames of Example 2 and Comparative Example 3 were used as test samples for moisture sensitivity level testing, so as to determine the delamination of the lead frames of Example 2 and Comparative Example 3 at their conductive wire regions and lead regions.

With reference to FIG. 2, the lead frames 1 of Example 2 and Comparative Example 3 are each divided into a conductive wire region A1 and a lead region A2. Multiple leads 41 are disposed in the lead region A2 and surround the conductive wire region A1. With reference to FIGS. 1 and 2, the silver oxide layer 31 of Example 2 is formed on the silver-plated layer 21 at the conductive wire region A1 and the lead region A2. To ensure the significance of the experiments, both of the lead frames of Example 2 and Comparative Example 3 had the same dimensions, and the areas of the conductive wire region and of the lead region of Example 2 were respectively identical to those of Comparative Example 3. The difference of the lead frames between Example 2 and Comparative Example 3 was mainly in whether a silver oxide layer with suitable thickness is formed on the silver-plated layer or not.

First, a mold is preheated at 175° C. for 4 hours. Then the lead frames were disposed in the preheated mold and left standing at 85° C. and a relative humidity of 85% for 168 hours. After passing a reflow test under 260° C. at most, the adhesive strength between each of the lead frames and the molding compound was measured by a scanning acoustic microscope, SAM, and a strength tester, so as to determine the degree of molding compound delamination from the lead frames of Example 2 and Comparative Example 3. In the instant test example, the delamination was identified when any signal was detected at the interface between the lead frame and the molding compound by the strength tester. The percentage of delamination area, which was calculated by dividing the delamination area in each region by the total area of each region then multiplying 100, represented that the delamination occurs at each of the lead frames. The higher percentage of delamination area indicated the delamination problem was more severe at the region.

As the experimental results indicated, for the lead frame of Example 2, the percentages of delamination areas at the conductive wire region and at the lead region were both 0.14%. However, for the lead frame of Comparative Example 3, the percentages of the delamination areas at the conductive wire region and at the lead region were respectively up to 92.92% and 2.78%.

It can be seen that only slight delamination of the lead frame of Example 2 occurs at its conductive wire region and its lead region. However, for the lead frame of Comparative Example 3, delamination occurs at both of the conductive wire region and the lead region. More particularly, a severe delamination occurs between the silver-plated layer and the molding compound at the conductive wire region of the lead frame of Comparative Example 3.

From the results of Test Examples 3 to 5, forming a silver-plated layer and a silver oxide layer with a suitable thickness in the lead frame sequentially can improve the adhesive strength between the lead frame and the molding compound on the premise of maintaining the bonding force between the lead frame and the gold wire. Accordingly, the present invention not only ensures the bonding force between the lead frame and the bonding wires but also improves the adhesive strength between the lead frame and the molding compound, such that the problem of delamination between the lead frame and the molding compound can be largely reduced by adopting the technical means of the present invention.

Test Example 6: Reflectivity

The reflectivity of the lead frames of Example 1 and Comparative Example 1 were measured by a spectrophotometer, KONICA MINOLTA, CM-2600d. The variation of the reflectivity between Example 1 and Comparative Example 1 was about ±0.5%. The results were shown in FIG. 8.

Figure 8:
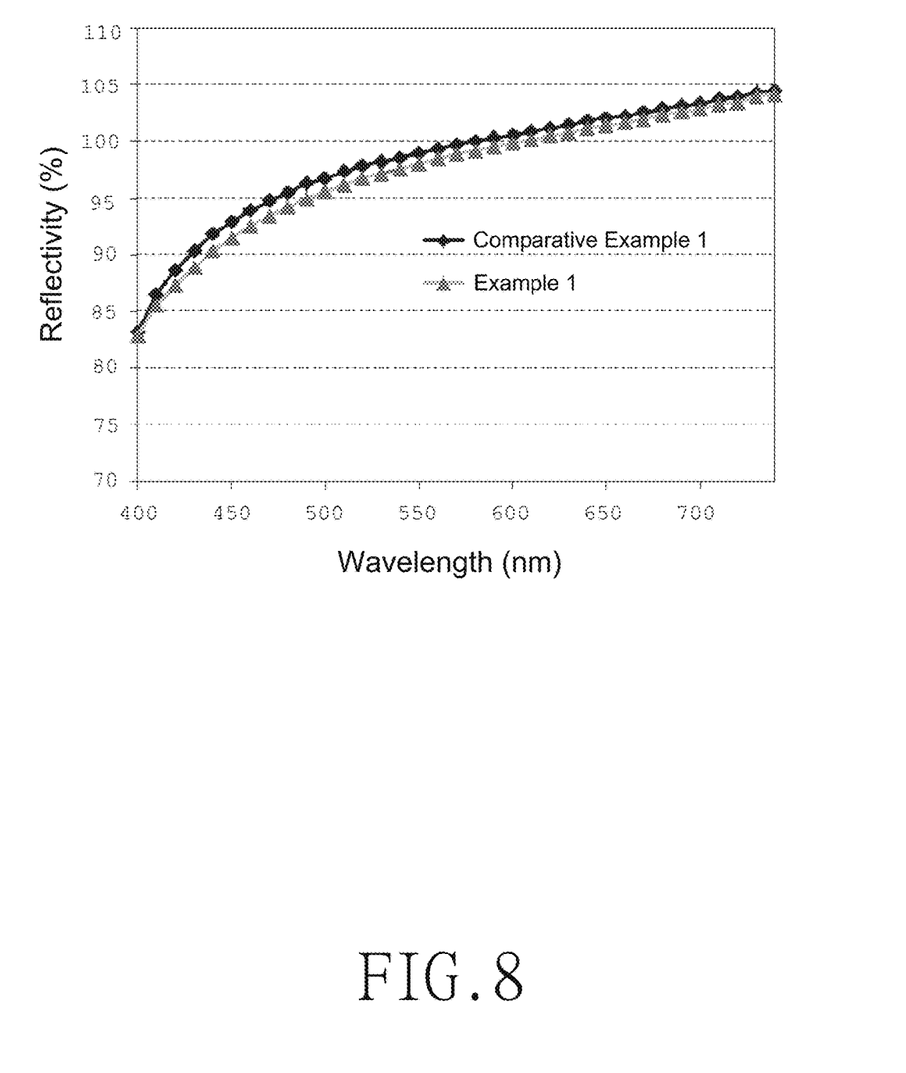
FIG. 8 shows the reflectivity of the lead frames with regard to Example 1 and Comparative Example 1.

With reference to FIG. 8, the reflectivity curve obtained from the lead frame of Example 1 had almost no difference from that of Comparative Example 1. The results establish that forming a silver oxide layer with suitable thickness in the lead frame does not reduce the reflectivity of the lead frame. Accordingly, the lead frame of Example 1 not only overcomes the shortcomings in the prior art but also is more applicable for the field of light-emitting diodes.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed si:

1. A lead frame comprising:
    a metal base;
    a silver-plated layer disposed on the metal base;
    a silver oxide layer disposed on the silver-plated layer and having a thickness equal to or more than 1.3 nanometers,
    wherein a surface energy of the silver oxide layer ranges from 55 mN/m to 80 mN/m.

2. The lead frame as claimed in claim 1, wherein the thickness of the silver oxide layer is equal to or less than 2.5 nanometers.

3. The lead frame as claimed in claim 1, wherein the thickness of the silver oxide layer is equal to or more than 1.8 nanometers.

4. The lead frame as claimed in claim 3, wherein the thickness of the silver oxide layer is equal to or more than 2 nanometers.

5. The lead frame as claimed in claim 1, wherein a thickness of the silver-plated layer is equal to or more than 100 nanometers.

6. The lead frame as claimed in claim 5, wherein the thickness of the silver-plated layer is equal to or less than 3.5 micrometers.

7. The lead frame as claimed in claim 2, wherein a thickness of the silver-plated layer is equal to or more than 100 nanometers.

8. The lead frame as claimed in claim 7, wherein the thickness of the silver-plated layer is equal to or less than 3.5 micrometers.

9. The lead frame as claimed in claim 1, wherein a thickness of the metal base is equal to or more than 80 micrometers.

10. The lead frame as claimed in claim 1, wherein the lead frame has an anti epoxy bleed out layer disposed on an outer surface of the silver oxide layer.

11. The lead frame as claimed in claim 1, wherein the lead frame has a roughened layer disposed between the metal base and the silver-plated layer.

12. The lead frame as claimed in claim 11, wherein the roughened layer is a copper-plated layer or a nickel-plated layer.

13. The lead frame as claimed in claim 1, wherein a surface oxygen content of the silver oxide layer ranges from 20% to 70%.

14. The lead frame as claimed in claim 2, wherein a surface oxygen content of the silver oxide layer ranges from 20% to 70%.

15. The lead frame as claimed in claim 6, wherein a surface oxygen content of the silver oxide layer ranges from 20% to 70%.

16. The lead frame as claimed in claim 8, wherein a surface oxygen content of the silver oxide layer ranges from 20% to 70%.

\* \* \* \* \*